(12) United States Patent
Oh et al.

(10) Patent No.: US 10,229,749 B2
(45) Date of Patent: Mar. 12, 2019

(54) NONVOLATILE MEMORY STORAGE SYSTEM

(71) Applicants: Eun Chu Oh, Hwaseong-si (KR); Pilsang Yoon, Hwaseong-si (KR); Jun Jin Kong, Yongin-si (KR); Hong Rak Son, Anyang-si (KR); Dongsup Jin, Seoul (KR)

(72) Inventors: Eun Chu Oh, Hwaseong-si (KR); Pilsang Yoon, Hwaseong-si (KR); Jun Jin Kong, Yongin-si (KR); Hong Rak Son, Anyang-si (KR); Dongsup Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 20 days.

(21) Appl. No.: 15/475,670

(22) Filed: Mar. 31, 2017

(65) Prior Publication Data

US 2018/0286495 A1    Oct. 4, 2018

(51) Int. Cl.
| | | |
|---|---|---|
| *G11C 29/50* | (2006.01) | |
| *G11C 16/04* | (2006.01) | |
| *G11C 16/26* | (2006.01) | |
| *G11C 16/10* | (2006.01) | |

(52) U.S. Cl.
CPC .... *G11C 29/50004* (2013.01); *G11C 16/0466* (2013.01); *G11C 16/0483* (2013.01); *G11C 16/10* (2013.01); *G11C 16/26* (2013.01); *G11C 2029/5004* (2013.01)

(58) Field of Classification Search
CPC .......... G11C 29/50004; G11C 16/0466; G11C 16/0483; G11C 16/10; G11C 16/26; G11C 2029/5004

USPC ................. 714/721, 718; 365/185.24, 185.2, 365/185.33, 185.18, 189.09, 189.17, 365/210.1

See application file for complete search history.

(56) References Cited

U.S. PATENT DOCUMENTS

| | | | |
|---|---|---|---|
| 7,679,133 B2 | 3/2010 | Son et al. | |
| 7,889,563 B2 | 2/2011 | Cho et al. | |
| 8,040,725 B2 | 10/2011 | Kang | |

(Continued)

OTHER PUBLICATIONS

U.S. Office Action dated Sep. 6, 2018 issued in co-pending U.S. Appl. No. 16/003,729.
U.S. Appl. No. 16/003,729, filed Jun. 8, 2018.

*Primary Examiner* — John J Tabone, Jr.
(74) *Attorney, Agent, or Firm* — Harness, Dickey & Pierce, P.L.C.

(57) ABSTRACT

A nonvolatile memory storage system includes a plurality of memory cells and a memory controller configured to transmit a read command to a nonvolatile memory device based on a plurality of read voltages. The nonvolatile memory device performs a first read operation on a first level among the N levels based on a first read voltage among the plurality of read voltages, counts the number of on-cells that respond to the first read voltage among the plurality of memory cells, and adjusts a level of a second read voltage to be used to perform a second read operation on the first level or a second level among the N levels among the plurality of read voltages according to a comparison result of the counted number of on-cells and the number of reference cells.

15 Claims, 16 Drawing Sheets

(56) References Cited

U.S. PATENT DOCUMENTS

| | | | |
|---|---|---|---|
| 8,107,295 B2* | 1/2012 | Lee | G11C 8/08 365/185.18 |
| 8,365,030 B1* | 1/2013 | Choi | G06F 11/1048 714/746 |
| 8,369,141 B2 | 2/2013 | Sommer et al. | |
| 8,553,466 B2 | 10/2013 | Han et al. | |
| 8,559,235 B2 | 10/2013 | Yoon et al. | |
| 8,634,587 B2 | 1/2014 | Nagumo et al. | |
| 8,644,099 B2 | 2/2014 | Cometti et al. | |
| 8,665,645 B2 | 3/2014 | Avraham et al. | |
| 8,737,129 B2* | 5/2014 | Lee | G11C 8/10 365/185.09 |
| 8,869,008 B2 | 10/2014 | Baum et al. | |
| 8,929,140 B2 | 1/2015 | Nagashima | |
| 9,036,417 B2 | 5/2015 | Chen et al. | |
| 9,058,878 B2* | 6/2015 | Aritome | G11C 11/5642 |
| 9,224,493 B2* | 12/2015 | Lee | G11C 8/10 |
| 9,263,137 B2 | 2/2016 | Lee | G11C 16/10 |
| 9,412,471 B2* | 8/2016 | Kim | G06F 11/1068 |
| 9,437,306 B2* | 9/2016 | Lee | G11C 16/10 |
| 9,443,578 B2* | 9/2016 | Lee | G11C 16/10 |
| 9,508,423 B2* | 11/2016 | Kim | G11C 11/5621 |
| 9,558,816 B2 | 1/2017 | Han et al. | |
| 9,563,503 B2* | 2/2017 | Seo | G06F 11/1068 |
| 9,564,237 B2* | 2/2017 | Lee | G11C 8/10 |
| 9,570,184 B2 | 2/2017 | Mokhlesi | |
| 9,665,425 B2* | 5/2017 | Seo | G06F 11/1068 |
| 9,691,488 B1 | 6/2017 | Griffin et al. | |
| 9,892,796 B2 | 2/2018 | Jin et al. | |
| 2010/0046289 A1* | 2/2010 | Baek | G11C 11/5628 365/185.2 |
| 2010/0124119 A1* | 5/2010 | Lee | G11C 8/08 365/185.18 |
| 2011/0233648 A1 | 9/2011 | Seol et al. | |
| 2012/0120732 A1* | 5/2012 | Lee | G11C 8/10 365/185.22 |
| 2013/0016562 A1 | 1/2013 | Mun | |
| 2013/0235662 A1* | 9/2013 | Fujiu | G11C 16/3459 365/185.03 |
| 2013/0318422 A1 | 11/2013 | Weathers et al. | |
| 2014/0126285 A1* | 5/2014 | Kang | G11C 16/26 365/185.2 |
| 2014/0229131 A1 | 8/2014 | Cohen et al. | |
| 2014/0254271 A1* | 9/2014 | Lee | G11C 8/10 365/185.11 |
| 2014/0293696 A1* | 10/2014 | Lin | G11C 16/26 365/185.12 |
| 2014/0321204 A1* | 10/2014 | Yang | G11C 16/26 365/185.03 |
| 2015/0003151 A1* | 1/2015 | Lee | G11C 16/10 365/185.02 |
| 2015/0085571 A1 | 3/2015 | Hu et al. | |
| 2015/0117107 A1* | 4/2015 | Sun | G11C 16/10 365/185.03 |
| 2015/0261467 A1* | 9/2015 | Seo | G06F 11/1068 714/758 |
| 2015/0262694 A1* | 9/2015 | Seo | G06F 11/1068 714/764 |
| 2016/0004437 A1* | 1/2016 | Kim | G11C 29/021 714/764 |
| 2016/0078955 A1* | 3/2016 | Lee | G11C 8/10 365/185.11 |
| 2016/0111162 A1* | 4/2016 | Lee | G11C 16/10 365/185.03 |
| 2016/0141024 A1* | 5/2016 | Lee | G11C 16/10 365/185.03 |
| 2016/0225439 A1* | 8/2016 | Kim | G11C 11/5621 |
| 2016/0225440 A1* | 8/2016 | Han | G11C 16/26 |
| 2017/0200505 A1* | 7/2017 | Jin | G11C 16/26 |
| 2017/0300252 A1* | 10/2017 | Yim | G06F 3/0619 |
| 2018/0004417 A1* | 1/2018 | Park | G06F 3/0614 |
| 2018/0075919 A1* | 3/2018 | Pang | G11C 16/3495 |
| 2018/0122483 A1* | 5/2018 | Yang | G11C 16/06 |
| 2018/0122484 A1* | 5/2018 | Jin | G06F 3/0679 |

* cited by examiner

| Read Sequence | | | | | | | | |
|---|---|---|---|---|---|---|---|---|
| Page | LSB | | CSB | | | | MSB | |
| Read Voltage Level | RD2 | RD5 | RD1 | RD3 | | RD6' (RD6+ΔRD6_3) | RD4 | RD7 |
| Sequence | 1 | 2 | 1 | 2 | Cell Count Operation | 3 | 1 | 2 |

FIG. 11

| Page | LSB | | LSB | CSB | CSB | CSB | MSB | MSB |
|---|---|---|---|---|---|---|---|---|
| Read Voltage Level | RD2 | RD5' (RD5+ΔRD5_2) | | RD1 | RD3 | RD6' (RD6+ΔRD6_1) | RD4 | RD7 |
| Sequence | 1 | 2 | | 1 | 2 | 3 | 1 | 2 |

Cell Count Operation (under RD5' column)

Cell Count Operation (under RD6' column)

FIG. 13

| Page | LSB | | | CSB | | | MSB | |
|---|---|---|---|---|---|---|---|---|
| Read Level | RD2 | RD5 | RD1 | RD3 | RD6 | RD4 | | RD7' (RD7+ΔRD7_4) |
| Sequence | 1 | 2 | 1 | 2 | 3 | 1 | | 2 |
| | | Cell Count Operation | | Cell Count Operation | | | | Cell Count Operation |

Read Sequence

FIG. 15

| Page | LSB | | | CSB | | | MSB | |
|---|---|---|---|---|---|---|---|---|
| Read Level | RD2 | RD5' (RD5+ΔRD5_2) | RD1 | RD3 | RD6' (RD6+ΔRD6_1) | RD4 | RD7' (RD7+ΔRD7_4) |
| Sequence | 1 | 2 | 1 | 2 | 3 | 1 | 2 |
| | | Cell Count Operation | | | Cell Count Operation | | | Cell Count Operation |

Read Sequence

NONVOLATILE MEMORY STORAGE SYSTEM

TECHNICAL FILED

The inventive concept relates to electronic devices, and more particularly, to a nonvolatile memory storage system.

DESCRIPTION OF THE RELATED ART

A semiconductor memory device is implemented using a semiconductor such as silicon Si, germanium Ge, gallium arsenide GaAs, indium phosphide InP, etc. A semiconductor memory device is classified as a volatile memory device or a nonvolatile memory device.

A nonvolatile memory device retains its stored data even when a power supply is interrupted. Examples of the nonvolatile memory device are a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (RRAM), a ferroelectric RAM (FRAM), etc.

Because of a high operation speed and low power consumption, a flash memory is being used in various fields. A flash memory may include charge trap flash (CTF) memory cells. The charge trap flash (CTF) memory cell can remember a program state by storing charges in a charge storage layer. Charges stored in the charge storage layer of the charge trap flash (CTF) memory cells are programmed and then flow into a channel. As charges flow into the channel, a distribution of threshold voltages of the charge trap flash (CTF) memory cells may be changed. Because of a physical characteristic of the charge trap flash (CTF) memory cells, reliability of data stored in the memory cells may be degraded.

SUMMARY

Some example embodiments may provide a nonvolatile memory storage system. The nonvolatile memory storage system includes a nonvolatile memory device and a memory controller. The nonvolatile memory device includes a plurality of memory cells each constituted by a cell of N (N is a natural number greater than 1)-levels and reads data stored in the plurality of memory cells based on a plurality of read voltages. The memory controller transmits a read command to the nonvolatile memory device so that the data is read from the nonvolatile memory device.

The nonvolatile memory device performs a first read operation on a first level among the N-levels based on a first read voltage among the plurality of read voltages, counts the number of on-cells that respond to the first read voltage among the plurality of memory cells, perform a second read operation adjusting a level of a second read voltage to be used to perform to second read operation on the first level or a second level among the N-levels among the plurality of read voltages according to a comparison result of the counted number of on-cells and the number of reference cells and the second read voltage is applied after the first read voltage.

Some example embodiments may provide a nonvolatile memory storage system. The nonvolatile memory storage system includes a plurality of memory cells including a three-dimensional (3D) structure, and a memory controller configured to control the nonvolatile memory device so that the data is read from the nonvolatile memory device.

the nonvolatile memory device includes each constituted by a cell of N (N is a natural number greater than 1)-levels, reads data stored in the plurality of memory cells based on a plurality of read voltages, performs a first read operation on a first level among the N-levels based on a first read voltage among the plurality of read voltages, counts the number of on-cells or off-cells that respond to the first read voltage among the plurality of memory cells, perform a second read operation adjusting a level of a second read voltage to be used to perform the second read operation on the first level or a second level among the N-levels among the plurality of read voltages according to a comparison result of the counted number of on-cell or off-cells and the number of reference cells and the second read voltage is applied after the first read voltage.

BRIEF DESCRIPTION OF THE FIGURES

Embodiments of the inventive concept will be described below in more detail with reference to the accompanying drawings. The embodiments of the inventive concept may, however, be implemented in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

FIG. 7 is a distribution diagram illustrating an initial program threshold voltage distribution of memory cells and a changed threshold voltage distribution of the memory cells as time goes by.

FIG. 8 is a view illustrating a read voltage level lookup table according to example embodiments of the inventive concept.

FIG. 9 is a table describing a characteristic of a cell count comparison operation which is selectively applied according to example embodiments of the inventive concept.

FIG. 11 is a table describing a characteristic of a cell count comparison operation which is selectively applied according to example embodiments of the inventive concept.

FIG. 13 is a table describing a characteristic of a cell count comparison operation which is selectively applied according to example embodiments of the inventive concept.

FIG. 15 is a table describing a characteristic of a cell count comparison operation which is selectively applied according to example embodiments of the inventive concept.

DETAILED DESCRIPTION OF THE EMBODIMENTS

In the following, embodiments of the inventive concept are described clearly and in detail so that a person skilled in the art to which the inventive concept pertains may easily practice the inventive concept.

Figure 1:
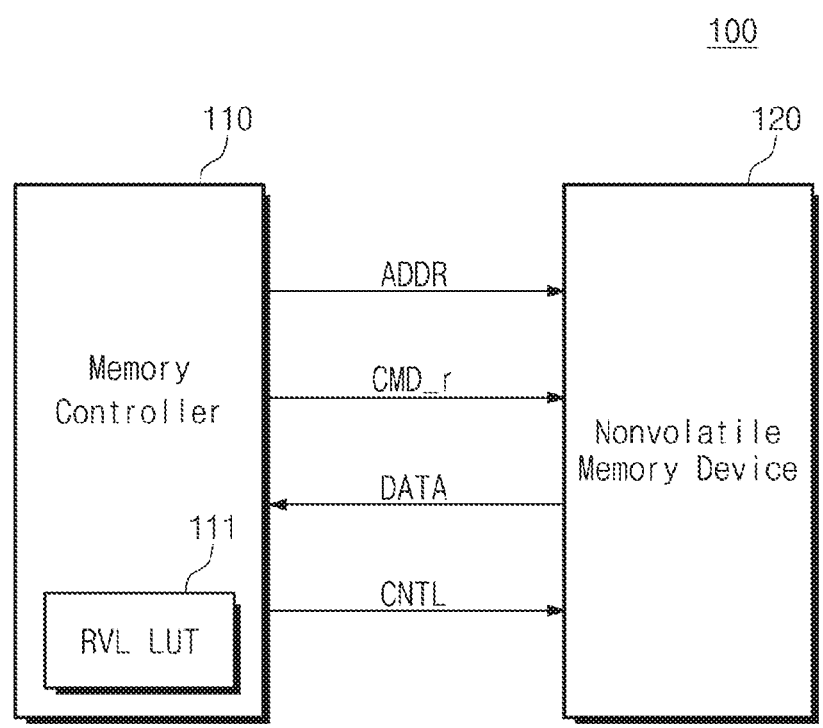
FIG. 1 is a block diagram describing a nonvolatile memory storage system according to example embodiments of the inventive concept.

FIG. 1 is a block diagram illustrating a nonvolatile memory storage system according to example embodiments of the inventive concept. Referring to FIG. 1, a nonvolatile memory storage system 100 may include a memory controller 110 and a nonvolatile memory device 120.

The memory controller 110 may control an overall operation of the nonvolatile memory device 120. For example, the memory controller 110 may transmit an address ADDR and a read command CMD_r to read data DATA stored in the nonvolatile memory device 120.

The nonvolatile memory device 120 may operate under the control of the memory controller 110. For example, the nonvolatile memory device 120 may receive the address ADDR and the read command CMD_r from the memory controller 110. The nonvolatile memory device 120 may transmit data DATA corresponding to the received address ADDR to the memory controller 110 in response to the received read command CMD_r.

The memory controller 110 may include a read voltage level lookup table 111. The read voltage level lookup table 111 may include information that maps a relation among read voltage level changes according to a reference cell count. The reference cell count is a value which is set to adjust a read voltage. The read voltage level lookup table 111 will be described with reference to FIG. 8.

After a program of the memory cells is completed, a threshold voltage distribution may be changed. When a read operation of the memory cells is performed using a predetermined read voltage, an error may occur. To reduce the number of errors and occurrence probability of the error, the nonvolatile memory device 120 may adjust a read voltage level. A specific method of adjusting a level of the read voltage will be described in detail through FIGS. 3 through 15.

The memory controller 110 may transmit information of the read voltage level lookup table 111 to the nonvolatile memory device 120 together with the read command CMD_r. For example, the memory controller 110 may transmit information of the read voltage level lookup table 111 to the nonvolatile memory device 120 only once together with the read command CMD_r. In another embodiment, whenever transmitting the read command CMD_r to the nonvolatile memory device 120, the memory controller 110 may transmit the information of the read voltage level lookup table 111 together. In still another embodiment, in response to a request of the nonvolatile memory device 120, the memory controller 110 may transmit the information of the read voltage level lookup table 111 to the nonvolatile memory device 120 together with the read command CMD_r. In still yet another embodiment, in response to a request of a user, the memory controller 110 may transmit the information of the read voltage level lookup table 111 to the nonvolatile memory device 120 together with the read command CMD_r.

For example, the read voltage level lookup table 111 may be periodically updated. The read voltage level lookup table 111 may be updated according to a request of a user. When the read voltage level lookup table 111 is updated, the memory controller 110 may transmit the information of the read voltage level lookup table 111 together.

The memory controller 110 may transmit a control signal CNTL to the nonvolatile memory device 120 to adjust a read voltage level of the nonvolatile memory device 120. The nonvolatile memory device 120 may adjust the read voltage level in response to the control signal CNTL.

The nonvolatile memory device 120 may count memory cells that form a current path in a channel in response to the read voltage. Otherwise, the nonvolatile memory device 120 may count memory cells that cut off a current path of a channel in response to the read voltage. A cell count may be a counting result of memory cells that form a current path in a channel or memory cells that cut off a current path of a channel in response to the read voltage. A count of the memory cells that form a current path in a channel in response to the read voltage is an on-cell count. A count of the memory cells that cut off a current path of a channel in response to the read voltage is an off-cell count.

The nonvolatile memory device 120 may receive the information of the read voltage level lookup table 111 from the memory controller 110. The nonvolatile memory device 120 may store the information of the read voltage level lookup table 111 in a ROM or in a memory (e.g., a code memory) as a part of a firmware code of the nonvolatile memory device 120. The nonvolatile memory device 120 may adjust the read voltage level using the information of the read voltage level lookup table 111 and the cell count in response to the control signal CNTL. When the cell count is greater than the reference cell count, the nonvolatile memory device 120 may adjust the read voltage level with reference to the read voltage level lookup table 111. The read voltage level lookup table 111 may include two or more adjustable voltage levels with reference to a single read level according to result of the comparison with the reference cell count.

The nonvolatile memory device 120 may read data DATA through the adjusted read voltage. The nonvolatile memory device 120 may transmit the read data DATA to the memory controller 110. The memory controller 110 may calculate read voltage level changes based on access environment information of when accessing the nonvolatile memory device 120. The environment information will be described with reference to FIG. 2.

Figure 2:
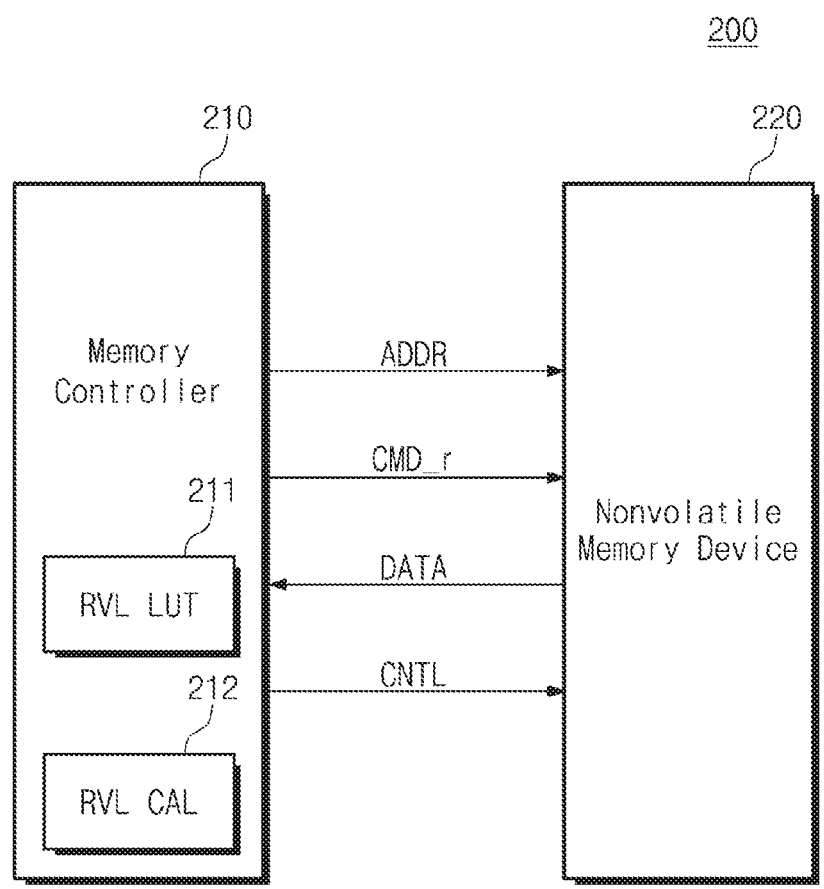
FIG. 2 is a block diagram illustrating a nonvolatile memory storage system according to other example embodiments of the inventive concept.

FIG. 2 is a block diagram illustrating a nonvolatile memory storage system according to other example embodiments of the inventive concept. Referring to FIG. 2, a nonvolatile memory storage system 200 may include a memory controller 210 and a nonvolatile memory device 220. Since the memory controller 210 and the nonvolatile memory device 220 illustrated in FIG. 2 are similar to or the same as the memory controller 110 and the nonvolatile memory device 120 illustrated in FIG. 1, a description thereof is omitted.

The memory controller 210 may include a read voltage level lookup table 211 and a read voltage level calculator 212. The read voltage level lookup table 211 may include information that maps a relation among read voltage level changes according to a reference cell count.

The read voltage level calculator 212 may include a hardware configuration, a software configuration, or a hybrid configuration thereof. The read voltage level calculator 212 may include a special-purpose hardware circuit configured to perform a specific operation. The read voltage level calculator 212 may include at least one processor core that can execute an instruction set of a program code configured to perform the specific operation. The read voltage level calculator 212 may calculate read voltage level changes based on access environment information. The access environment information may include at least one of target block information, target string selection line information, target word line information, temperature information, program and erase count information, and cell count information.

The target block information may include an address of a memory block in which a read operation is performed or information about a location of the target block in all memory blocks (e.g., information about whether the target block is located at the center of the memory blocks or outskirts of the memory blocks). The target string selection line information may include an address of a string selection line corresponding to a page in which a read operation is performed or information about a location of the string selection line in the target block.

The target word line information may include information about an address of a word line connected to a page in which a read operation is performed or information about a location of a word line in the target block. The temperature information indicates a temperature of when the controller 210 performs a read operation on the nonvolatile memory device 220.

The program and erase count information indicates the number of times that program and erase operations are performed. The cell count indicates an on-cell count or an off-cell count.

The memory controller 210 may transmit at least one of information of the read voltage level lookup table 211 and information about read voltage level changes calculated in the read voltage level calculator 212 to the nonvolatile memory device 220.

The memory controller 210 illustrated in FIG. 2 includes the read voltage level lookup table 211 and the read voltage level calculator 212. However, the inventive concept is not limited thereto and the memory controller 210 may include only the read voltage level calculator 212. When the memory controller 210 calculates read voltage level changes using the read voltage level calculator 212, the memory controller 210 may directly reflect access environment information of when accessing the nonvolatile memory device 120. Because of this, the memory controller 210 can accurately calculate read voltage level changes reflected in a read voltage.

Figure 3:
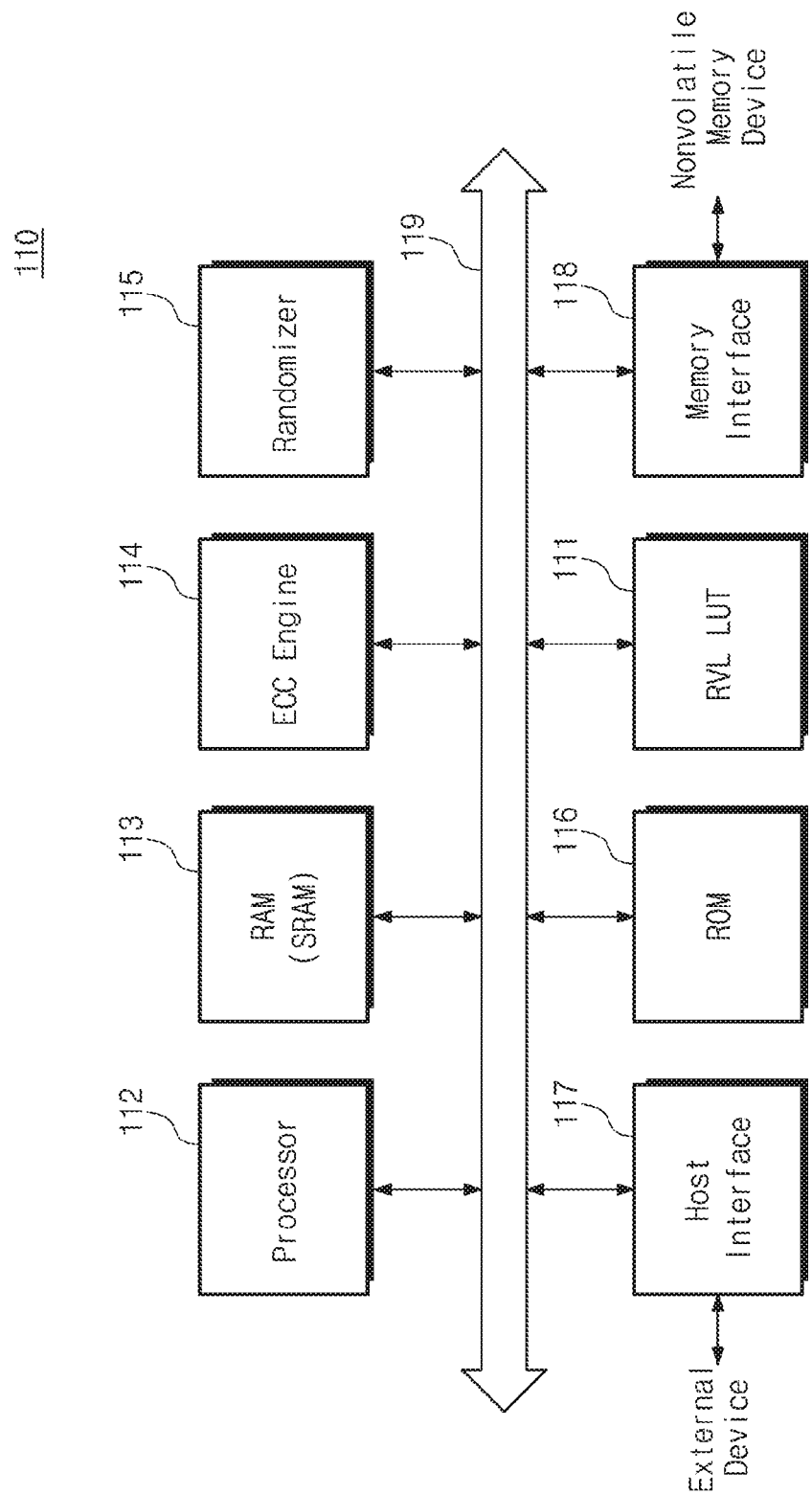
FIG. 3 is a block diagram illustrating a memory controller illustrated in FIG. 1.

FIG. 3 is a block diagram illustrating a memory controller illustrated in FIG. 1. Referring to FIG. 3, the memory controller 110 may include a read voltage lookup table 111, a processor 112, a RAM 113, an ECC (error correcting code) engine 114, a randomizer 115, a ROM 116, a host interface 117, a memory interface 118, and a bus 119.

The processor 112 may include at least one processor core that can execute an instruction set of a program code configured to perform a specific operation. Each of the ECC engine 114 and the randomizer 115 may include a hardware configuration, a software configuration, or a hybrid configuration thereof to perform operations that will be described later. Each of the ECC engine 114 and the randomizer 115 may include a special-purpose hardware circuit configured to perform a specific operation. Each of the ECC engine 114 and the randomizer 115 may include at least one processor core that can execute an instruction set of a program code configured to perform the specific operation.

The read voltage lookup table 111 may be managed on a per-memory block basis. The read voltage lookup table 111 may be predetermined or updated according to a program and erase count of the memory block and a characteristic of the memory block. The read voltage lookup table 111 may be managed on a per-word line basis. The read voltage lookup table 111 may be predetermined or updated according to a location of the word line. The read voltage lookup table 111 may be managed in units of read voltages. The read voltage lookup table 111 may be predetermined or updated on each of the read voltages.

The read voltage lookup table 111 may be stored in the RAM 113 and may be updated by the processor 112. The read voltage lookup table 111 may be stored in the ROM 116 in the form of firmware. The read voltage lookup table 111 updated by the processor 112 may be flushed to the nonvolatile memory device 120.

The processor 112 may control an overall operation of the memory controller 110. The processor 112 may execute a command code of firmware stored in the ROM 116. The RAM 113 may operate as at least one of a buffer memory, a cache memory, an operation memory, and a main memory. The RAM 113 may store the read voltage lookup table 111. The RAM 113 may be a SRAM.

The ECC engine 114 may generate an error correction code on data to be stored in the nonvolatile memory device 120. The ECC engine 114 may detect an error of data DATA read from the nonvolatile memory device 120 and may correct the detected error based on the error correction code.

The randomizer 115 may randomize data DATA to be stored in the nonvolatile memory device 120. For example, memory cells of the nonvolatile memory device 120 may be triple level cells (TLC) each of which stores 3-bit data. In this case, each of the triple level cells (TLC) may be programmed to have one of an erase state and a plurality of program states. The randomizer 115 may randomize data DATA so that program states of memory cells connected to one word line have the same ratio. When randomized data is stored in the memory cells connected to one word line, the number of memory cells having the erase state among the memory cells connected one word line and the number of memory cells having each program state among the memory cells connected one word line are the same.

The ROM 116 may store various types of information required to operate the memory controller 110. The ROM 116 may store various types of information in the form of firmware.

The memory controller 110 may communicate with an external device (e.g., host) through the host interface 117. The memory controller 110 may communicate with the nonvolatile memory device 120 through the memory interface 118. The host interface 117 may include various interfaces such as a USB (universal serial bus), a MMC (multimedia card), an eMMC (embedded MMC), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics), a MIPI (mobile industry processor interface), a NVMe (nonvolatile memory-express), etc.

The bus 119 may connect the read voltage lookup table 111, the processor 112, the RAM 113, the ECC engine 114, the randomizer 115, the ROM 116, the host interface 117, and the memory interface 118 to one another. The read voltage lookup table 111, the processor 112, the RAM 113, the ECC engine 114, the randomizer 115, the ROM 116, the host interface 117, and the memory interface 118 may communicate with one another through the bus 119.

As described above, the memory controller 110 transmits a read command CMD_r and information of the read voltage lookup table 111 to the nonvolatile memory device 120 together. The nonvolatile memory device 120 adjusts a read voltage level with reference to the read command CMD_r and the information of the read voltage lookup table 111.

Figure 4:
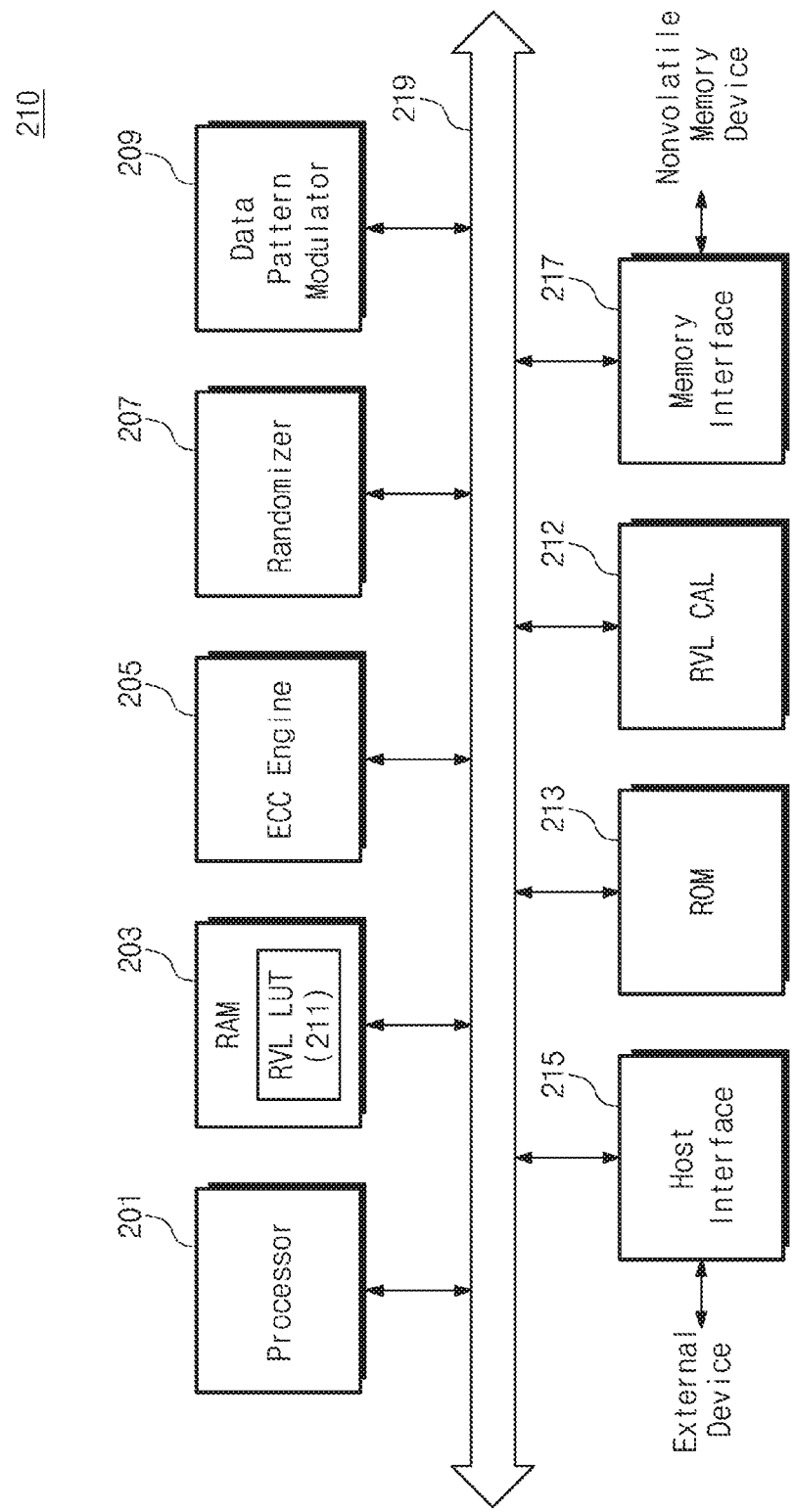
FIG. 4 is a block diagram illustrating a memory controller illustrated in FIG. 2.

FIG. 4 is a block diagram illustrating a memory controller illustrated in FIG. 2. The memory controller 210 may include a processor 201, a RAM 203, an ECC engine 205, a randomizer 207, a data pattern modulator 209, a read voltage level calculator 212, a ROM 213, a host interface 215, a memory interface 217, and a bus 219.

Since the processor 201, the ECC engine 205, the randomizer 207, the ROM 213, the host interface 215, the memory interface 217, and the bus 219 are similar to or the same as the processor 112, the ECC engine 114, the randomizer 115, the ROM 116, the host interface 117, the memory interface 118, and the bus 119, a description thereof is omitted.

A read voltage lookup table 211 may be stored in the RAM 203 and may be updated by the processor 201. The read voltage lookup table 211 may be stored in the ROM 213 in the form of firmware. However, the present inventive concept is not limited thereto, the read voltage lookup table 211 updated by the processor 201 may be flushed to the nonvolatile memory device 220.

The data pattern modulator 209 may include a hardware configuration, a software configuration, or a hybrid configuration thereof to perform operations that will be described later. The data pattern modulator 209 may include a special-purpose hardware circuit configured to perform a specific operation. The data pattern modulator 209 may include at least one processor core that can execute an instruction set of a program code configured to perform the specific operation.

The data pattern modulator 209 may reduce the number of data corresponding to an error-prone program state to prevent deterioration of data stored in memory cells of the nonvolatile memory device 220. When the nonvolatile memory device 220 includes triple level cells (TLC), memory cells included in the nonvolatile memory device 220 may be programmed to one of an erase state and first through seventh program states. At this time, a threshold voltage of the seventh program state has the highest level. The data pattern modulator 209 may reduce the number of memory cells programmed to the seventh program state by reducing the number of 3-bit data corresponding to the seventh program state.

Figure 5:
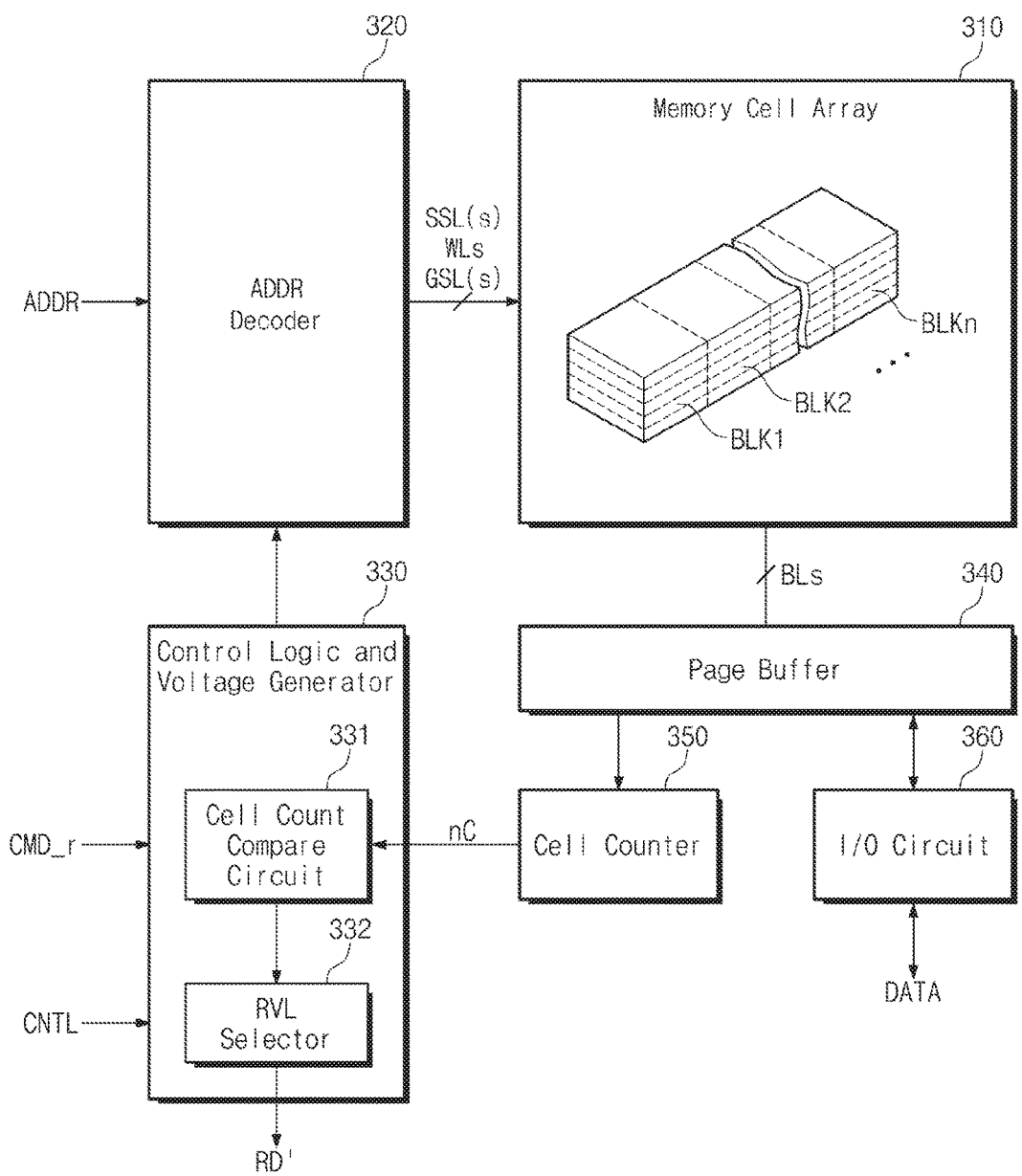
FIG. 5 is a block diagram illustrating a nonvolatile memory device according to example embodiments of the inventive concept.

FIG. 5 is a block diagram illustrating a nonvolatile memory device according to example embodiments of the inventive concept. Referring to FIG. 5, a nonvolatile memory device 300 may include a memory cell array 310, an address decoder 320, a control logic and voltage generator 330, a page buffer 340, a cell counter 350, and an input/output circuit 360. Referring to FIGS. 1, 2 and 5, the nonvolatile memory device 300 may be similar to or the same as the nonvolatile memory devices 120 and 220 illustrated in FIGS. 1 and 2.

The memory cell array 310 includes a plurality of memory blocks (BLK1~BLKn, n is an integer equal to or greater than 2). Each of the memory blocks includes a plurality of strings. Each of the strings is connected to a plurality of bit lines BL. Each of the strings is connected to a plurality of memory cells. The memory cells are connected to a plurality of word lines WL respectively. Each memory cell may be provided as either a triple-level cell (TLC) or a quadruple-level cell (QLC) including bits greater than 2 bits. The memory cell array 310 will be described with reference to FIG. 6.

The address decoder 320 is connected to the memory cell array 310 through a plurality of word lines WLs, at least one string selection line SSL(s), and at least one ground selection line GSL(s). The address decoder 320 receives an address ADDR from the memory controller 110 or 210. The address decoder 320 is configured to decode the received address ADDR. The address decoder 320 may control a voltage applied to the word lines WLs based on the decoded address ADDR.

The control logic and voltage generator 330 may include a cell count comparison circuit 331 and a read voltage level selector 332. The control logic and voltage generator 330 may control the address decoder 320 and the input/output circuit 360. The control logic and voltage generator 330 receives a read command CMD_r. The control logic and voltage generator 330 may control the address decoder 320, the page buffer 340, and the input/output circuit 360 to perform a read operation in response to the received read command CMD_r.

The control logic and voltage generator 330 may perform a cell count comparison operation at a specific point in time of the read operation. When performing at least one of a plurality of read operations, the control logic and voltage generator 330 may perform a cell count comparison operation together. The cell count comparison operation is an operation of comparing a reference cell count with a cell count based on the read voltage. The cell count comparison circuit 331 may refer to information of the read voltage level lookup table 111 or 211 included in the read command CMD_r to perform the cell count comparison operation. The cell count comparison circuit 331 may refer to information of read voltage level changes calculated from the read voltage level calculator 212. The cell count comparison circuit 331 may refer to a cell count nC provided from the cell counter 350.

In one read operation, the cell count comparison circuit 331 may compare the reference cell count with the cell count nC based on one read voltage. In the plurality of read operations, the cell count comparison circuit 331 may perform the cell count comparison operation several times. The cell count comparison circuit 331 transmits a comparison result to the read voltage level selector 332. The read voltage level selector 332 receives the comparison result from the cell count comparison circuit 331.

The read voltage level selector 332 may select a read voltage level through the comparison result. The read voltage level selector 332 may refer to the information of the read voltage level changes of the read voltage level lookup table 111 to select the read voltage level. The read voltage level selector 332 may adjust at least one level of the read voltages not used in the read operation. The read voltage level selector 332 may output a new read voltage RD' having an adjusted voltage level. The cell count comparison circuit 331 and the read voltage level selector 332 may be implemented in the form of hardware.

The cell counter 350 may count a memory cell (e.g., on-cell) that forms a current path in a channel in response to the read voltage in a specific time. The cell counter 350 may count a memory cell (e.g., off-cell) that cuts off a current path of a channel in response to the read voltage in a specific time. The cell counter 350 may count a memory cell (e.g., on-cell) that forms a current path in a channel or a memory cell (e.g., off-cell) that cuts off a current path of a channel in response to the read voltage in one of the plurality of read operations. The cell counter 350 transmits the cell count nC to the control logic and voltage generator 330.

The input/output circuit 360 provides data DATA provided from the outside to the page buffer 340. In a read operation of the nonvolatile memory device 300, the input/output circuit 360 receives data DATA from the page buffer 340. The input/output circuit 360 may transmit the received data to the memory controller 110 or 210.

Figure 6:
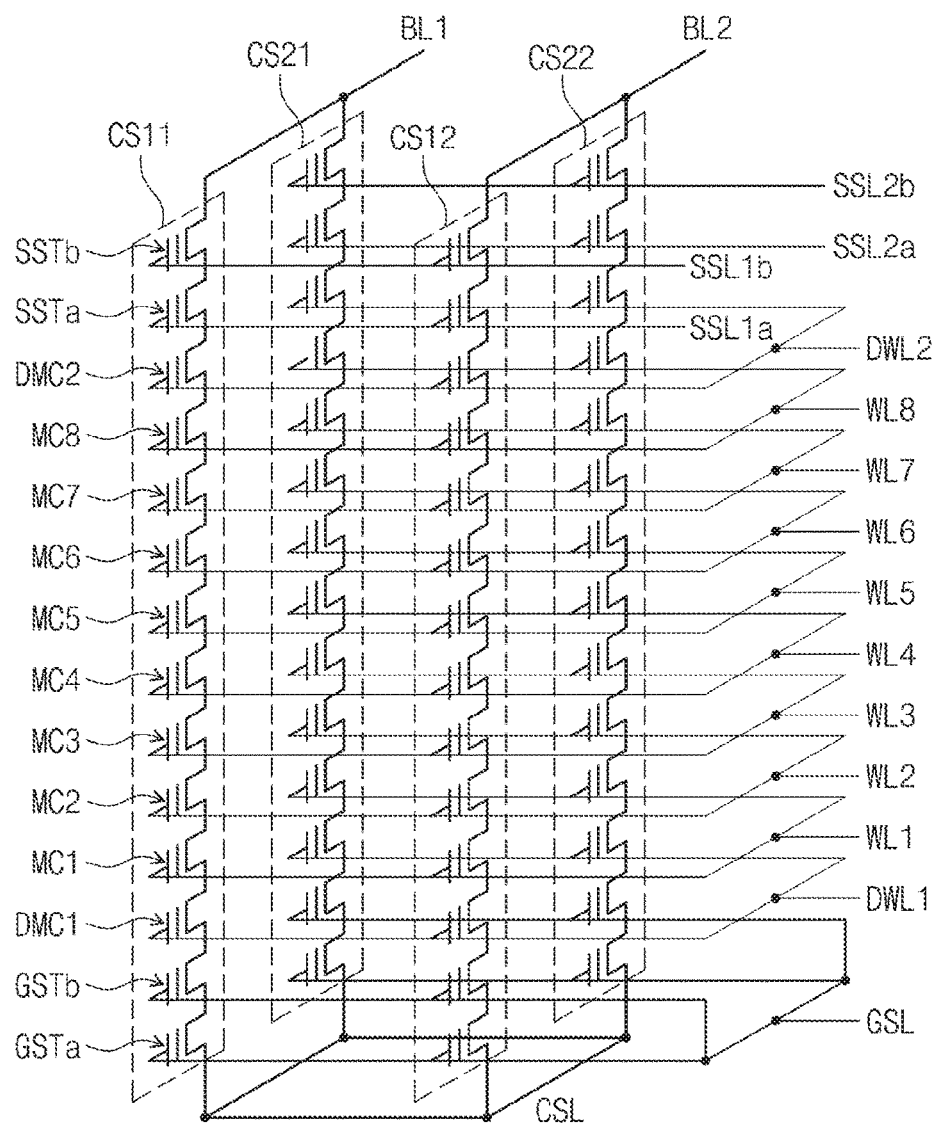
FIG. 6 is a circuit diagram illustrating a memory block included in a nonvolatile memory device of FIG. 5.
Figure 6:
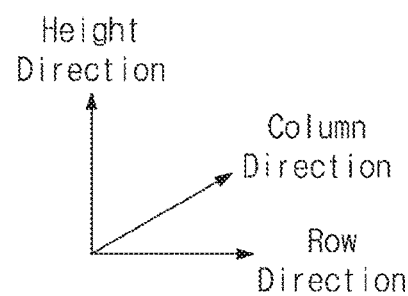

FIG. 6 is a circuit diagram describing a memory block included in a nonvolatile memory device of FIG. 5. A memory block BLKn having a three-dimensional (3D) structure will be described with reference to FIG. 6. However, the present inventive concept is not limited thereto, and the remaining memory blocks BLK1 to BLKn–1 may have the same or similar structures as that of the memory block BLKn. Referring to FIG. 6, the memory block BLKn includes a plurality of cell strings CS11, CS12, CS21, and CS22. The cell strings CS11, CS12, CS21, and CS22 may be arranged along a row direction and a column direction to form rows and columns.

Each of the cell strings CS11, CS12, CS21, and CS22 may include a plurality of cell transistors. For example, each of the cell strings CS11, CS12, CS21, and CS22 may include string selection transistor SSTa and SSTb, a plurality of memory cells MC1 to MC8, ground selection transistors GSTa and GSTb, and dummy memory cell DMC1 and DMC2. In an exemplary embodiment, each of the memory cells MC1 to MC8 included in the cell strings CS11, CS12, CS21, and CS22 may be a charge trap flash (CTF) memory cell.

In each cell string, the memory cells MC1 to MC8 may be serially connected to each other and may be stacked in a height direction that is a direction perpendicular to a plane defined by the row direction and the column direction. In each cell string, the string selection transistors SSTa and SSTb may be serially connected to each other and may be arranged between the memory cells MC1 to MC8 and a bit line BL. In each cell string, the ground selection transistors GSTa and GSTb may be serially connected to each other and may be arranged between the memory cells MC1 to MC8 and a common source line CSL.

In an exemplary embodiment, in each cell string, a first dummy memory cell DMC1 may be arranged between the memory cells MC1 to MC8 and the ground selection transistors GSTa and GSTb. In an exemplary embodiment, in each cell string, a second dummy memory cell DMC2 may be arranged between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In an exemplary embodiment, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line.

In an exemplary embodiment, although not illustrated in FIG. 6, ground selection transistors at the same height from a substrate (not illustrated) may be connected to the same ground selection line, and ground selection transistors at different heights may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells of the same height from the substrate or the ground selection transistors GSTa and GSTb may be connected in common to the same word line, and memory cells of different heights therefrom may be connected to different word lines. For example, the first to eighth memory cells MC1 to MC8 in the cell strings CS11, CS12, CS21, and CS22 may be connected in common to first to eighth word lines WL1 to WL8, respectively.

First string selection transistors, which belong to the same row, from among the first string selection transistors SSTa at the same height may be connected to the same string selection line, and first string selection transistors belonging to different rows may be connected to different string selection lines. For example, the first string selection transistors SSTa of the cell strings CS11 and CS12 in the first row may be connected in common to a string selection line SSL1a, and the first string selection transistors SSTa of the cell strings CS21 and CS22 in the second row may be connected in common to a string selection line SSL2a.

Likewise, second string selection transistors, which belong to the same row, from among the second string selection transistors SSTb at the same height may be connected to the same string selection line, and second string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

Although not shown in FIG. 6, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In an exemplary embodiment, dummy memory cells at the same height may be connected with the same dummy word line, and dummy memory cells at different heights may be connected with different dummy word lines. For example, the first dummy memory cells DMC1 may be connected with the first dummy word line DWL1, and the second dummy memory cells DMC2 may be connected with the second dummy word line DWL2.

In an exemplary embodiment, the memory block BLKz illustrated in FIG. 6 is only exemplary. The number of cell strings may increase or decrease, and the number of rows of cell strings and the number of columns of cell strings may increase or decrease according to the number of cell strings. Also, in the memory block BLKz, the number of cell transistors (GST, MC, DMC, SST, etc.) may increase or decrease. Also, a height of the memory block BLKn may increase or decrease according to the number of cell transistors. Furthermore, the number of lines (GSL, WL, DWL, SSL, etc.) connected with cell transistors may increase or decrease according to the number of cell transistors.

The following patent documents, which are hereby incorporated by reference, describe suitable configurations for 3D memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 7:
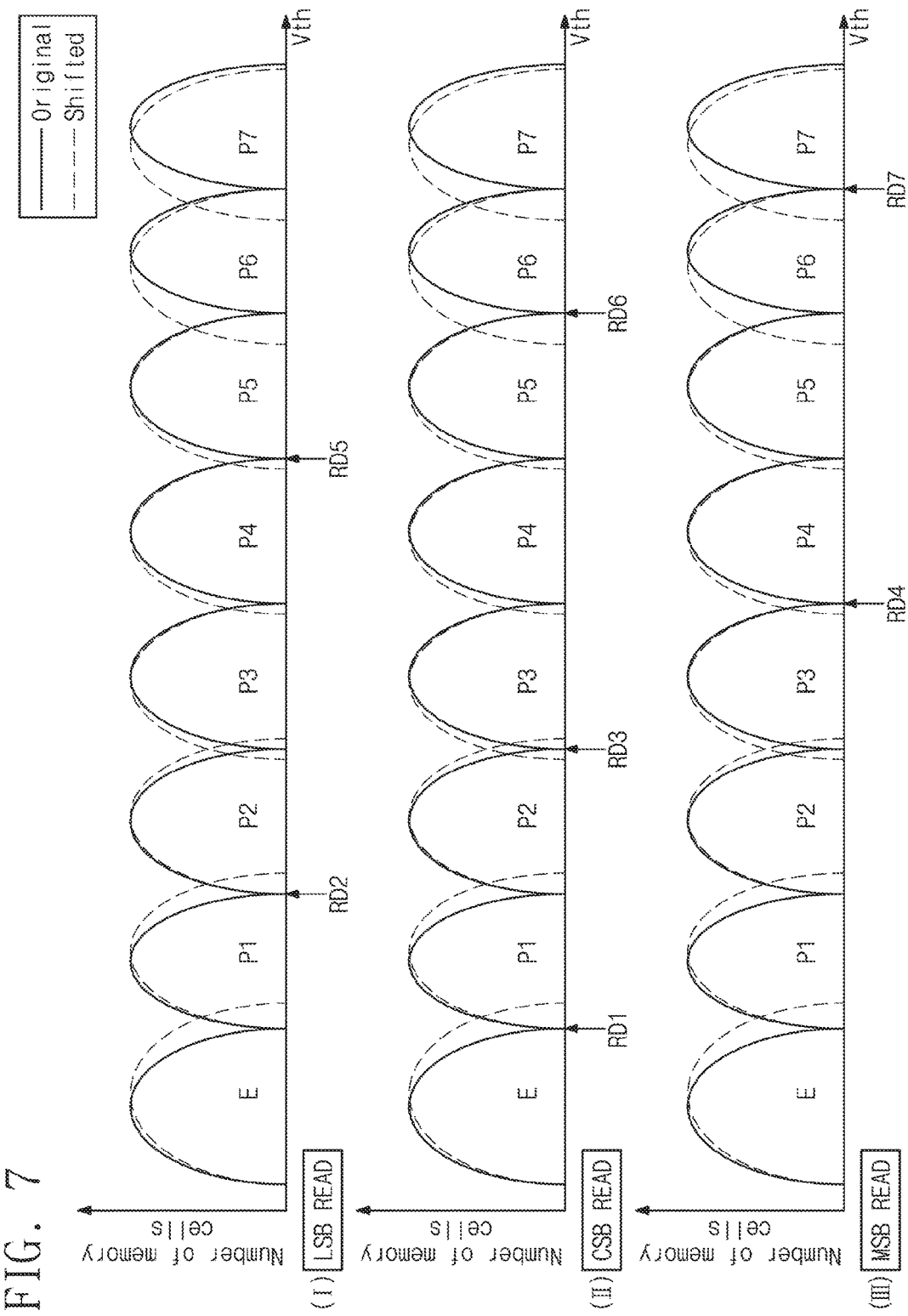

FIG. 7 is a distribution diagram describing an initial program threshold voltage distribution of memory cells and a changed threshold voltage distribution of the memory cells as time goes by. Referring to FIG. 7, a method of reading a triple level cell (TLC) capable of storing 3-bit data on a per-page basis is disclosed.

A change of a threshold voltage distribution of memory cells may be different depending on a programmed state. For example, in the case of an erase state E or a low-order program state (e.g., P1), the threshold voltage distribution tends to be shifted in a direction where threshold voltages increase. In the case of an erase state high-order program states (e.g., P6, and P7), the threshold voltage distribution tends to be shifted in a direction where threshold voltages decrease. In the case of intermediate-order program states (e.g., P2, P3, P4, and P5), there is little or no shift in the threshold voltage distribution.

Referring to FIGS. 1, 2 and 5 together, the nonvolatile memory device 120, 220, and 300 may determine a program state of memory cells programmed using first through seventh read voltages RD1 to RD7. The first through seventh read voltages RD1 to RD7 may be generated by the control logic and voltage generator 330. Each of the first through seventh read voltages RD1 to RD7) may have a predetermined voltage level to determine a program state of the programmed memory cells.

To read the least significant bit (LSB) page, the second and fifth read voltages RD2 and RD5 may be sequentially applied. The second read voltage RD2 may be used to distinguish between a state having a threshold voltage lower than a first program state P1 and a state having a threshold voltage higher than a second program state P2. The fifth read voltage RD5 may be used to distinguish between a state having a threshold voltage lower than a fourth program state P4 and a state having a threshold voltage higher than a fifth program state P5.

To read the center significant bit (CSB) page, the first, third and sixth read voltages RD1, RD3, and RD6 may be sequentially applied. The first read voltage RD1 may be used to distinguish between a state having a threshold voltage lower than the erase state E and a state having a threshold voltage higher than the first program state P1. The third read voltage RD3 may be used to distinguish between a state having a threshold voltage lower than the second program state P2 and a state having a threshold voltage higher than a third program state P3. The sixth read voltage RD6 may be used to distinguish between a state having a threshold voltage lower than the fifth program state P5 and a state having a threshold voltage higher than a sixth program state P6.

To read the most significant bit (MSB) page, the fourth and seventh read voltages RD4, and RD7 may be sequentially applied. The fourth read voltage RD4 may be used to distinguish between a state having a threshold voltage lower than the third program state P3 and a state having a threshold voltage higher than the fourth program state P4. The seventh read voltage RD7 may be used to distinguish between a state having a threshold voltage lower than the sixth program state P6 and a state having a threshold voltage higher than a seventh program state P7.

The first through seventh read voltages RD1 to RD7 of the nonvolatile memory device 300 (120, and 220) may be determined based on a stabilized threshold voltage distribution (e.g., a threshold voltage distribution after a predetermined time goes by). However, as illustrated in FIG. 7, the threshold voltage distribution of the program states E to P7 may be shifted as time goes by. The program states E to P7 may also be shifted by a program disturbance, a read disturbance, or a coupling phenomenon. In the case of reading the programmed memory cells using the read voltages RD1 to RD7, the nonvolatile memory device 300 (120, and 220) may read data DATA including an error. To prevent data including an error from being read, the nonvolatile memory device 300 (120, and 220) performs a cell count at a specific time. The nonvolatile memory device 300 (120, and 220) may adjust at least one level of the read voltages to at least one level not used in the read operation.

Figure 8:
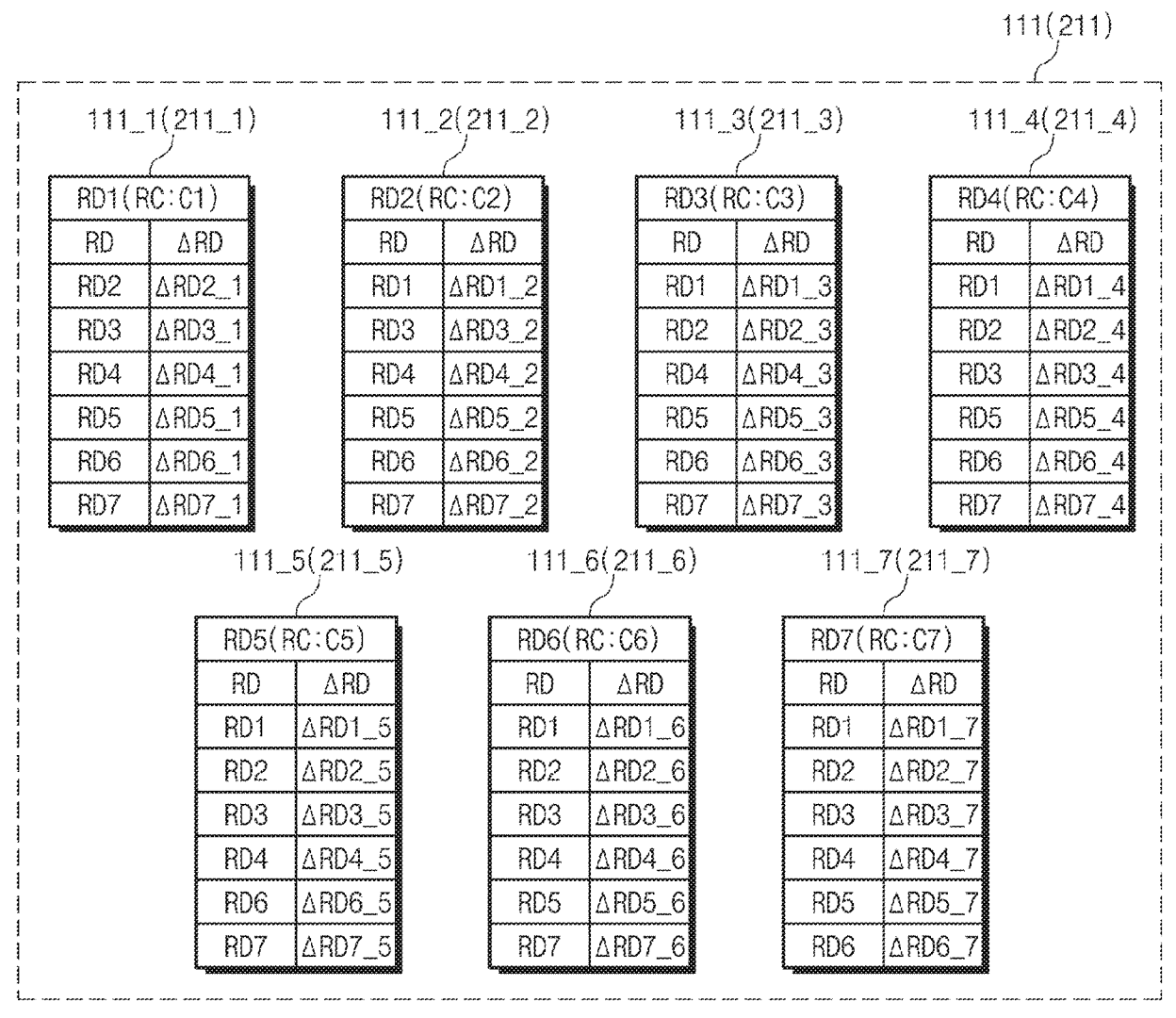

FIG. 8 is a view describing a read voltage level lookup table according to example embodiments of the inventive concept. Referring to FIGS. 1, 2 and 8, the memory controller 110, and 210 may include the read voltage level lookup table 111 (211). The read voltage level lookup table 111 (211) includes mapping information on read voltage level changes according to the reference cell count.

The read voltage level lookup table 111 (211) is a table for adjusting a read voltage on pages including a triple-level cell (TLC). This is an example for describing the inventive concept. Information included in the read voltage level lookup table 111 (211) may become different depending on a storable bit of a page of the nonvolatile memory device 120, 220. The read voltage level lookup table 111 may include a plurality of tables 111_1(211_1) to 111_7(211_7). The plurality of tables 111_1(211_1) to 111_7(211_7) map a plurality of read voltage level changes on the read voltages RD1 to RD7 respectively. The read voltages RD1 to RD7 may be voltages determined based on the threshold voltage distribution (e.g., stabilized threshold voltage distribution) before being shifted.

Referring to the first read voltage level lookup table 111_1(211_1), the first read voltage RD1 is a reference cell count and has a first reference cell count C1. When a cell count comparison operation on the first read voltage RD1 is performed, the first read voltage level lookup table 111_1 (211_1) may include mapping information of the read voltages RD2 to RD7 and a plurality of read voltage level changes $\Delta RD2\_1$ to $\Delta RD7\_1$. At least one of the second through seventh read voltages RD2 to RD7 may be changed as much as a corresponding read voltage level changes among the plurality of read voltage level changes $\Delta RD2\_1$ to $\Delta RD7\_1$.

Referring to FIGS. 5 and 7, the second and third read voltage level changes $\Delta RD2\_1$, and $\Delta RD3\_1$ according to the first read voltage RD1 may be a positive value. This is because, in the case of the low-order program states P1, and P2, the threshold voltage distribution tends to be shifted in a direction where threshold voltages increase. To perform an accurate read operation, the second and third read voltage levels RD2, and RD3 have to increase. The fourth through seventh read voltage level changes $\Delta RD4\_1$ to $\Delta RD7\_1$ according to the first read voltage RD1 may be a negative value. This is because, in the case of the center program states P3 to P5 and the high-order states P6, and P7, the threshold voltage distribution tends to be shifted in a direction where threshold voltages decrease. To perform an accurate read operation, the fourth through seventh read voltage levels RD4 to RD7 have to increase. This is merely an example of the inventive concept and the plurality of read voltage level changes $\Delta RD2\_1$ to $\Delta RD7\_1$ according to the first read voltage RD1 may become different depending on a tendency where the threshold voltage distribution is shifted.

Referring to the second read voltage level lookup table 111_2(211_2), the second read voltage RD2 is a reference cell count and has a second reference cell count C2. When a cell count comparison operation on the second read voltage RD2 is performed, the second read voltage level lookup table 111_2(211_2)) may include mapping information of the read voltages RD1, and RD3 to RD7 and a plurality of read voltage level changes ΔRD1_2, and ΔRD3_2 to ΔRD7_2. At least one of the first and third through seventh read voltages RD1, and RD3 to RD7 may be changed as much as a corresponding read voltage level changes among the plurality of read voltage level changes ΔRD1_2, and ΔRD3_2 to ΔRD7_2.

Referring to FIGS. 5 and 7, the first and third read voltage level changes ΔRD1_2, and ΔRD3_2 according to the second read voltage RD2 may be a positive value. The fourth through seventh read voltage level changes ΔRD4_2 to ΔRD7_2 according to the second read voltage RD2 may be a negative value. This is merely an example of the inventive concept and the plurality of read voltage level changes (ΔRD1_2, ΔRD3_2, and ΔRD4_2 to ΔRD7_2) according to the second read voltage RD2 may become different depending on a tendency where the threshold voltage distribution is shifted.

Referring to the third read voltage level lookup table 111_3(211_3), the third read voltage RD3 is a reference cell count and has a third reference cell count C3. When a cell count comparison operation on the third read voltage RD3 is performed, the third read voltage level lookup table 111_3 (211_3) may include mapping information of the read voltages RD1, RD2, and RD4 to RD7 and a plurality of read voltage level changes ΔRD1_3, ΔRD2_3, and ΔRD4_3 to ΔRD7_3. At least one of the first, second, fourth through seventh read voltages RD1, RD2, and RD4 to RD7 may be changed as much as a corresponding read voltage level changes among the plurality of read voltage level changes ΔRD1_3, ΔRD2_3, ΔRD4_3 to ΔRD7_3.

Referring to FIGS. 5 and 7, the first and second read voltage level changes ΔRD1_3, and ΔRD2_3 according to the third read voltage RD3 may be a positive value. The fourth through seventh read voltage level changes ΔRD4_3 to ΔRD7_3 according to the third read voltage RD3 may be a negative value. This is merely an example of the inventive concept and the plurality of read voltage level changes ΔRD1_3, ΔRD2_3, and ΔRD4_3 to ΔRD7_3 according to the third read voltage RD3 may become different depending on a tendency where the threshold voltage distribution is shifted.

Referring to the fourth read voltage level lookup table 111_4(211_4), the fourth read voltage RD4 is a reference cell count and has a fourth reference cell count C4. When a cell count comparison operation on the fourth read voltage RD4 is performed, the fourth read voltage level lookup table 111_4(211_4) may include mapping information of the read voltages RD1 to RD3, and RD5 to RD7 and a plurality of read voltage level changes ΔRD1_4 to ΔRD3_4, and ΔRD5_4 to ΔRD7_4. At least one of the first through third and fifth through seventh read voltages RD1 to RD3, and RD5 to RD7 may be changed as much as a corresponding read voltage level changes among the plurality of read voltage level changes ΔRD1_4 to ΔRD3_4, and ΔRD5_4 to ΔRD7_4.

Referring to FIGS. 5 and 7, the first through third read voltage level changes ΔRD1_4 to ΔRD3_4 according to the fourth read voltage RD4 may be a positive value. The fifth through seventh read voltage level changes ΔRD5_4 to ΔRD7_4 according to the fourth read voltage RD4 may be a negative value. This is merely an example of the inventive concept and the plurality of read voltage level changes ΔRD1_4 to ΔRD3_4, and ΔRD5_4 to ΔRD7_4 according to the fourth read voltage RD4 may become different depending on a tendency where the threshold voltage distribution is shifted.

Referring to the fifth read voltage level lookup table 111_5(211_5), the fifth read voltage RD5 is a reference cell count and has a fifth reference cell count C5. When a cell count comparison operation on the fifth read voltage RD5 is performed, the fifth read voltage level lookup table 111_5 (211_5) may include mapping information of the read voltages RD1 to RD4, RD6, and RD7 and a plurality of read voltage level changes ΔRD1_5 to ΔRD4_5, ΔRD6_5, and ΔRD7_5. At least one of the first through fourth and fifth through seventh read voltages RD1 to RD4, RD6, and RD7 may be changed as much as a corresponding read voltage level changes among the plurality of read voltage level changes ΔRD1_5 to ΔRD4_5, ΔRD6_5, and ΔRD7_5.

Referring to FIGS. 5 and 7, the first through third read voltage level changes ΔRD1_5 to ΔRD3_5 according to the fifth read voltage RD5 may be a positive value. The fourth, sixth, and seventh read voltage level changes ΔRD5_4, ΔRD6_5, and ΔRD7_5 according to the fifth read voltage RD5 may be a negative value. This is merely an example of the inventive concept and the plurality of read voltage level changes ΔRD1_5 to ΔRD4_5, ΔRD6_5, and ΔRD7_5 according to the fifth read voltage RD5 may become different depending on a tendency where the threshold voltage distribution is shifted.

Referring to the sixth read voltage level lookup table 111_6(211_6), the sixth read voltage RD6 is a reference cell count and has a sixth reference cell count C6. When a cell count comparison operation on the sixth read voltage RD6 is performed, the sixth read voltage level lookup table 111_6(211_6) may include mapping information of the read voltages RD1 to RD5, and RD7 and a plurality of read voltage level changes ΔRD1_6 to ΔRD5_6, and ΔRD7_6. At least one of the first through fifth and seventh read voltages RD1 to RD5, and RD7 may be changed as much as a corresponding read voltage level changes among the plurality of read voltage level changes ΔRD1_6 to ΔRD5_6, and ΔRD7_6.

Referring to FIGS. 5 and 7, the first through third read voltage level changes ΔRD1_6 to ΔRD3_6 according to the sixth read voltage RD6 may be a positive value. The fourth, fifth, and seventh read voltage level changes ΔRD4_6, ΔRD5_6, and ΔRD7_6 according to the sixth read voltage RD6 may be a negative value. This is merely an example of the inventive concept and the plurality of read voltage level changes ΔRD1_6 to ΔRD5_6, and ΔRD7_6 according to the sixth read voltage RD6 may become different depending on a tendency where the threshold voltage distribution is shifted.

Referring to the seventh read voltage level lookup table (111_7(211_7)), the seventh read voltage RD7 is a reference cell count and has a seventh reference cell count C7. When a cell count comparison operation on the seventh read voltage RD7 is performed, the seventh read voltage level lookup table 111_7(211_7) may include mapping information of the read voltages RD1 to RD6 and a plurality of read voltage level changes ΔRD1_7 to ΔRD6_7. At least one of the first through sixth read voltages RD1 to RD6 may be changed as much as a corresponding read voltage level changes among the plurality of read voltage level changes ΔRD1_7 to ΔRD6_7.

Referring to FIGS. 5 and 7, the first through third read voltage level changes ΔRD1_7 to ΔRD3_7 according to the seventh read voltage RD7 may be a positive value. The fourth through sixth read voltage level changes ΔRD4_7, to ΔRD6_7 according to the seventh read voltage RD7 may be a negative value. This is merely an example of the inventive concept and the plurality of read voltage level changes ΔRD1_7 to ΔRD6_7 according to the seventh read voltage RD7 may become different depending on a tendency where the threshold voltage distribution is shifted.

Referring to FIGS. 5 and 7, each of the plurality of reference cell counts C1 to C7 may be a value to minimize occurrence probability of an error in a read operation. Each of the plurality of reference cell counts C1 to C7 may also be a value to minimize the sum of the number of errors and occurrence probability of an error in a read operation. Information included in the read voltage level lookup table 111(211) is transmitted to the nonvolatile memory device 120, and 220 together with the read command CMD_r.

FIG. 9 is a table describing a characteristic of a cell count comparison operation which is selectively applied according to example embodiments of the inventive concept. Referring to FIG. 9, a read sequence for applying a read voltage level adjustment according to a cell count comparison operation among read operations of pages of a triple level cell (TLC) is classified according to page. A plurality of read operations may be performed on each of the pages.

Referring to FIG. 5 together with FIG. 9, the second and fifth read voltages RD2, and RD5 may be sequentially applied to the memory cell array 310 to perform a read operation of a page of the least significant bit (LSB). The first and third read voltages RD1, and RD3 may be sequentially applied to the memory cell array 310 to perform a read operation of a page of the center significant bit (CSB). A cell count operation and a cell count comparison operation may be performed before the sixth read voltage RD6 is applied.

The cell counter 350 may perform a cell count operation with reference to the third read voltage RD3. The cell counter 350 may transmit a cell count nC on the third read voltage RD3 to the cell count comparison circuit 331. The cell count comparison circuit 331 may perform a cell count comparison operation at a predetermined moment. The cell count comparison circuit 331 may also perform a cell count comparison operation in response to the control signal CNTL of the controller 110, and 210.

After the third read voltage RD3 is applied, the cell count comparison circuit 331 performs a cell count comparison operation. To perform the cell count comparison operation, the cell count comparison circuit 331 refers to the cell count nC provided from the cell counter 350. The cell counter 350 may count the number of on-cells or off-cells among memory cells having the third program state P3 in response to the third read voltage RD3.

To perform the cell count comparison operation, the cell count comparison circuit 331 may refer to information of the read voltage level lookup table 111_3(211_3) on the third read voltage RD3. The cell count comparison circuit 331 may refer to information of read voltage level changes calculated from the read voltage level calculator 212. The cell count comparison circuit 331 may compare the third reference cell count C3 on the third read voltage RD3 with the cell count nC on the third read voltage RD3.

When the cell count nC is an on-cell count, if the third reference cell count C3 is greater than the cell count nC on the third read voltage RD3 and a difference between the third reference cell count C3 and the cell count nC on the third read voltage RD3 is greater than a reference value, the cell count comparison circuit 331 may output a signal that controls the read voltage level selector 332. When the cell count nC is an off-cell count, if the third reference cell count C3 is greater than the cell count nC on the third read voltage RD3 and a difference between the third reference cell count C3 and the cell count nC on the third read voltage RD3 is smaller than the reference value, the cell count comparison circuit 331 may output a signal that controls the read voltage level selector 332. In this way, the cell count comparison circuit 331 may output a signal that controls the read voltage level selector 332 according to a comparison result of the cell count nC on the third read voltage RD3 and the third reference cell count C3.

The read voltage level selector 332 may output a new sixth read voltage (RD6'=RD6+ΔRD6_3) obtained by adding the sixth read voltage level changes ΔRD6_3 to the sixth read voltage RD6. The new sixth read voltage RD6' may be used as a read voltage on data stored in memory cell of the memory cell array 310. In a read operation of a center significant bit (CSB) page, the new sixth read voltage RD6' may be applied to the memory cell array 310 instead of the sixth read voltage RD6. To perform a read operation of a most significant bit (MSB) page, the fourth and seventh read voltages RD4, and RD7 are sequentially applied to the memory cell array 310.

Figure 10:
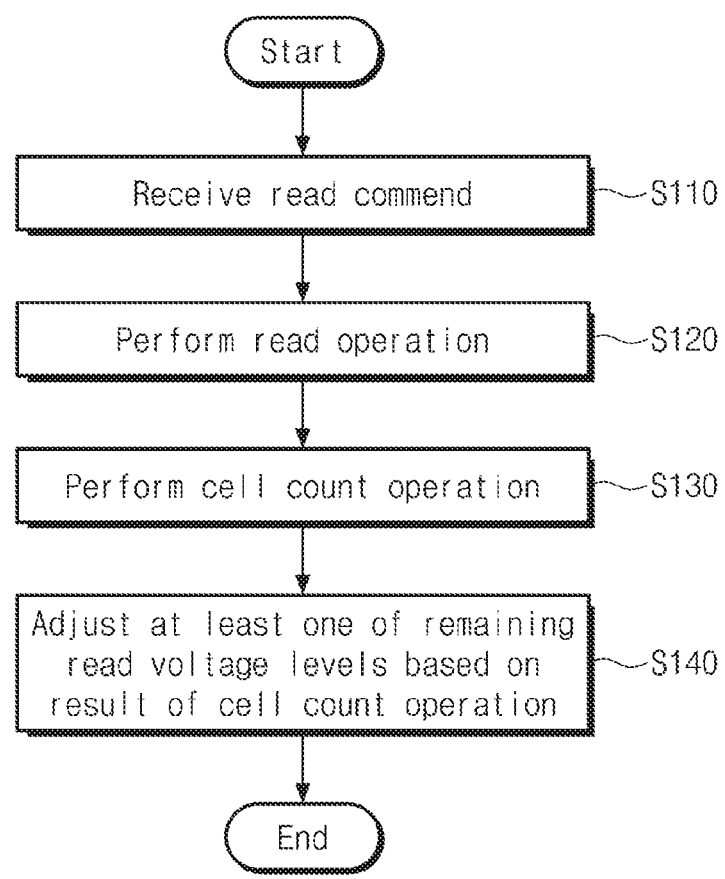
FIG. 10 is a flowchart describing a cell count comparison operation according to the sequence described in FIG. 8.

FIG. 10 is a flowchart describing a cell count comparison operation according to the sequence described in FIG. 9. Referring to FIGS. 1, 2, 5 and 10, in an operation S110, the nonvolatile memory device 300(120, and 220) may receive the read command CMD_r from the memory controller 110, and 210. The read command CMD_r may include information of the read voltage level lookup table 111(211). The read command CMD_r may include information of read voltage level changes calculated from the read voltage level calculator 212. In an operation S120, the nonvolatile memory device 300(120, and 220) may perform a read operation in response to the read command CMD_r.

In an operation S130, the nonvolatile memory device 300(120, and 220) may perform a cell count operation and a cell count comparison operation. The nonvolatile memory device 300(120, and 220) may perform a cell count operation and a cell count comparison operation on a read voltage among a plurality of read voltages.

In an operation S140, the nonvolatile memory device 300(120, and 220) may adjust at least one level of the read voltages not used in the read operation with reference to the read voltage level lookup table 111(211) and the cell count nC. The nonvolatile memory device 300(120, and 220) may adjust at least one level of the read voltages not used in the read operation with reference to information of read voltage level changes calculated from the read voltage level calculator 212 and the cell count nC. When a cell count on a read voltage among the plurality of read voltages goes beyond the specified range, the nonvolatile memory device 300(120, and 220) may adjust at least one level of the read voltages not used in the read operation.

FIG. 11 is a table describing a characteristic of a cell count comparison operation which is selectively applied according to example embodiments of the inventive concept. Referring to FIGS. 1, 2, 5 and 11, to perform a read operation of a page of the least significant bit (LSB), the second read voltage RD2 may be applied to the memory cell array 310. A cell count operation and a cell count comparison operation may be performed before the fifth read voltage RD5 is applied.

The cell counter 350 may perform a cell count operation on the second read voltage RD2. The cell counter 350 may transmit a cell count nC on the second read voltage RD2 to the cell count comparison circuit 331. The cell counter 350 may perform an on-cell count operation or an off-cell count operation on the second read voltage RD2.

To perform a cell count comparison operation, the cell count comparison circuit 331 may refer to information of the read voltage level lookup table 111_2(211_2) on the second read voltage RD2. The cell count comparison circuit 331 may refer to information of read voltage level changes calculated from the read voltage level calculator 212. The cell count comparison circuit 331 may compare the second reference cell count C2 on the second read voltage RD2 with the cell count nC on the second read voltage RD2.

According to a comparison result, the cell count comparison circuit 331 may output a signal that controls the read voltage level selector 332. According to a control signal, the read voltage level selector 332 may output a new fifth read voltage (RD5'=RD5+ΔRD5_2) obtained by adding the fifth read voltage level changes ΔRD5_2 to the fifth read voltage RD5. In a read operation of a page of the center significant bit (CSB) of FIG. 11, a cell count operation and a cell count comparison operation may be performed in concurrence with a read operation by the third read voltage RD3. As the cell count operation and the cell count comparison operation are performed in concurrence with the read operation by the third read voltage RD3, total read operation time may be reduced. To perform the cell count comparison operation, the cell count comparison circuit 331 may refer to information of the read voltage level lookup table 111_1(211_1) on the first read voltage RD1.

The cell counter 350 may transmit a cell count nC on the first read voltage RD1 to the cell count comparison circuit 331. The cell count comparison circuit 331 compares the first reference cell count C1 on the first read voltage RD1 with the cell count nC on the first read voltage RD1. A new sixth read voltage RD6' is applied to memory cells instead of the sixth read voltage RD6 by the cell count comparison operation. The new sixth read voltage RD6' is a value obtained by adding read voltage level changes ΔRD6_1 to the sixth read voltage RD6.

Figure 12:
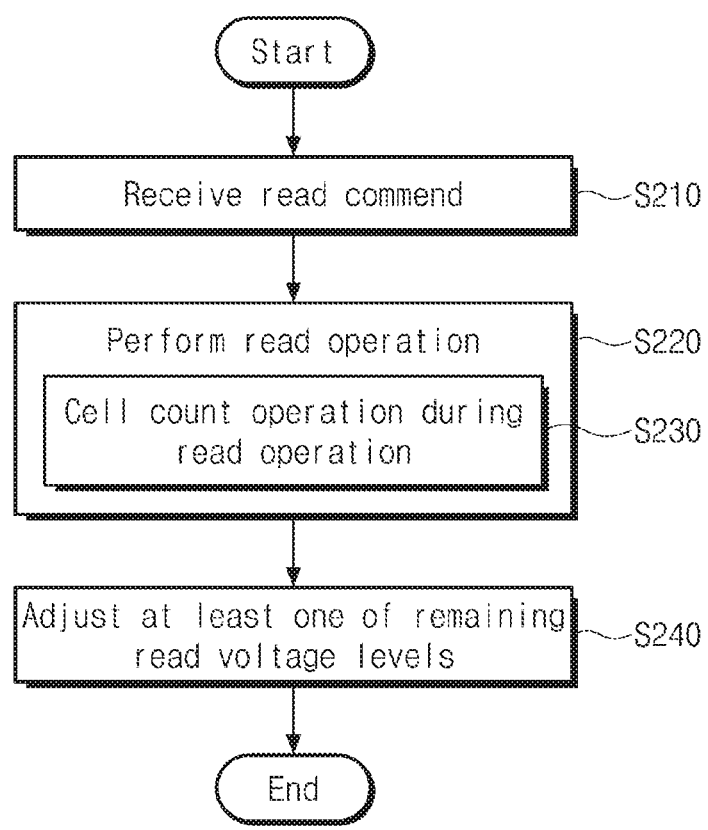
FIG. 12 is a flowchart describing a cell count comparison operation according to the sequence described in FIG. 10.

FIG. 12 is a flowchart describing a cell count comparison operation according to the sequence described in FIG. 11. Referring to FIGS. 1, 2, 5, 11 and 12, in an operation S210, the nonvolatile memory device 300(120, and 220) may receive a read command CMD_r from the memory controller 110, and 210. The read command CMD_r may include information of the read voltage level lookup table 111(211). The read command CMD_r may include information of the read voltage level changes calculated from the read voltage level calculator 212.

In an operation S220, the nonvolatile memory device 300(120, and 220) may perform a read operation in response to the read command CMD_r. In an operation S230, the nonvolatile memory device 300(120, and 220) may perform a cell count operation and a cell count comparison operation during the read operation. In an operation S240, the nonvolatile memory device 300(120, and 220) may adjust at least one level of the read voltages not used in the read operation with reference to the read voltage level lookup table 111(211) and a cell count nC.

According to a cell count comparison result, the nonvolatile memory device 120 may reflect the read voltage level changes of the read voltage level lookup table 111(211) to the read voltage and then may perform the read operation. The nonvolatile memory device 300(120, and 220) may adjust at least one level of the read voltages not used in the read operation with reference to the read voltage level changes calculated from the read voltage level calculator 212 and the cell count nC.

FIG. 13 is a table describing a characteristic of a cell count comparison operation which is selectively applied according to example embodiments of the inventive concept. Referring to FIGS. 1, 2, 5 and 13, the second read voltage RD2 may be applied to perform a read operation of the least significant bit (LSB). After the second read voltage RD2 is applied, a cell count operation and a cell count comparison operation may be performed. As a result of cell count comparison, when a cell count nC on the second read voltage RD2 is within a specified range, the read voltage level selector 332 may output the fifth read voltage RD5.

A process of a read operation of a page of the center significant bit (CSB) of FIG. 13 may be the same as or similar to that of FIG. 11. A cell count operation and a cell count comparison operation on the first read voltage RD1 may be performed together with a read operation on the third read voltage RD3. As a result of cell count comparison, when a cell count nC on the first read voltage RD1 is within a specified range, the read voltage level selector 332 may output the sixth read voltage RD6.

The fourth read voltage RD4 may be applied to perform a read operation of a page of the most significant bit (MSB). After the fourth read voltage RD4 is applied, the cell count operation and the cell count comparison operation may be performed. A level of the seventh read voltage RD7 may be adjusted according to a result of the cell count comparison operation. After a read operation of a page of the center significant bit (CSB) is completed, the read operation of the page of the most significant bit (MSB) is performed.

The fourth read voltage RD4 is applied to the memory cell array 310 to perform the read operation of the page of the most significant bit (MSB). A cell count operation and a cell count comparison operation on the fourth read voltage RD4 may be performed. A new seventh read voltage RD7' is applied to the memory cell array 310 instead of the seventh read voltage RD7 according to a comparison result. The new seventh read voltage RD7' is a value obtained by adding read voltage level changes ΔRD7_4 to the seventh read voltage RD7.

Figure 14:
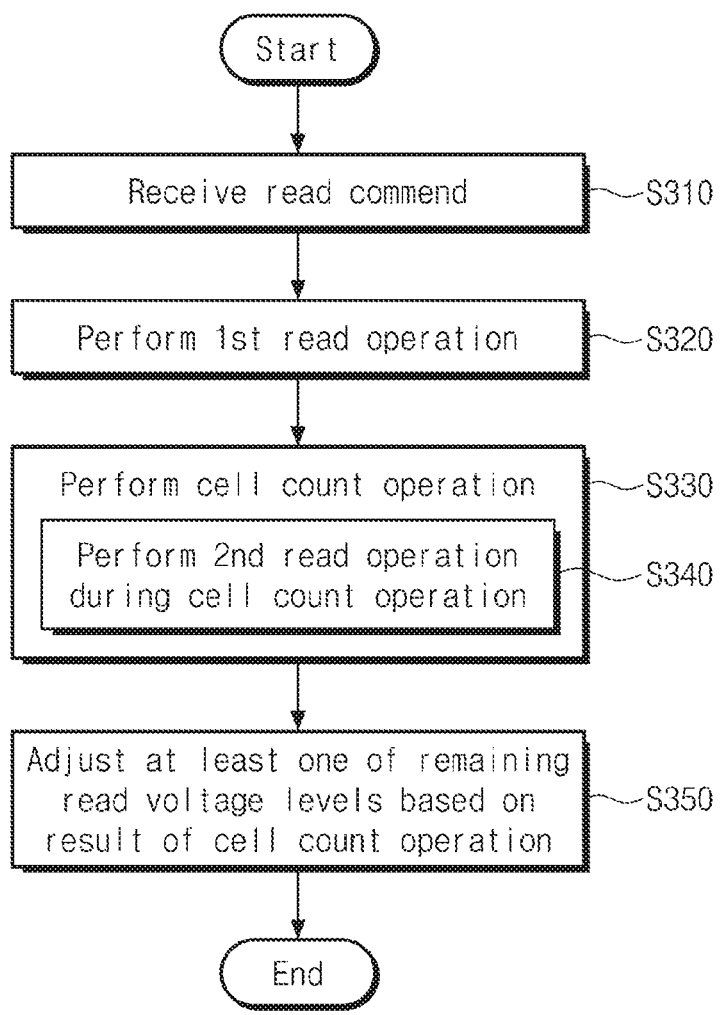
FIG. 14 is a flowchart describing a cell count comparison operation according to the sequence described in FIG. 12.

FIG. 14 is a flowchart describing a cell count comparison operation according to the sequence described in FIG. 13. Referring to FIGS. 1, 2, 5, 13 and 14, in an operation S310, the nonvolatile memory device 300(120, and 220) may receive a read command CMD_r from the memory controller 110, and 210. The read command CMD_r may include information of the read voltage level lookup table 111(211). The read command CMD_r may include information of the read voltage level changes calculated from the read voltage level calculator 212. In an operation S320, the nonvolatile memory device 300(120, and 220) may perform a first read operation in response to the read command CMD_r.

In an operation S330, the nonvolatile memory device 300(120, and 220) may perform a cell count operation and a cell count comparison operation. The nonvolatile memory device 300(120, and 220) may perform a cell count operation and a cell count comparison operation on a read voltage applied to perform the first read operation. In an operation S340, the nonvolatile memory device 300(120, and 220) may perform a second read operation during the cell count operation and the cell count comparison operation. The nonvolatile memory device 300(120, and 220) may perform the second read operation while performing the cell count operation and the cell count comparison operation on the read voltage applied to perform the first read operation.

In an operation S350, the nonvolatile memory device 300(120, and 220) may adjust at least one level of the read voltages not used in the read operation with reference to the read voltage level lookup table 111(211) and the cell count nC. The nonvolatile memory device 300(120, and 220) may adjust at least one level of the read voltages not used in the read operation with reference to information of read voltage level changes calculated from the read voltage level calculator 212 and the cell count nC. When a cell count on a read voltage applied to perform the first read operation goes beyond the specified range, the nonvolatile memory device 300(120, and 220) may adjust at least one level of the read voltages not used in the read operation.

FIG. 15 is a table describing a characteristic of a cell count comparison operation which is selectively applied according to example embodiments of the inventive concept. Referring to FIGS. 11 and 15, processes of read operation by the third read voltage RD3 of a page of the center significant bit (CSB) may be the same as or similar to each other. Levels of the sixth read voltage RD6 and the seventh read voltage RD7 may be adjusted according to the cell count comparison operation. After the third read voltage RD3 is applied, a new sixth read voltage RD6' may be applied. The fourth read voltage RD4 may be applied to perform a read operation of a page of the most significant bit (MSB). A new seventh read voltage RD7' is applied instead of the seventh read voltage RD7. Referring to FIG. 15, a level of at least one read voltage may be adjusted through the cell count comparison operation.

Referring to FIGS. 9, and 11 through 15, a cell count operation and a cell count comparison operation may be performed at least once in each page having a plurality of bits (LSB~MSB). At least one of an on-cell count operation and an off-cell count operation may be performed depending on a program state of memory cells. The on-cell count operation may be performed on memory cell programmed to the low-order program states P1, and P2. The off-cell count operation may be performed on memory cell programmed to the high-order program states P6, and P7. The on-cell count operation or the off-cell count operation may be performed on all the read voltages RD1 to RD7. The on-cell count operation or the off-cell count operation may also be performed on some of the read voltages RD1 to RD7.

The cell count comparison operation may be performed not only in a read operation by the third read voltage RD3 but also in read operations by the other read voltages RD1, RD2, and RD4 to RD7.

Levels of the read voltages RD1 to RD7 may be adjusted through the cell count comparison operation. For example, levels of high-order read voltages (e.g., RD6, and RD7) where a threshold voltage distribution is greatly shifted may be adjusted.

As described above, the levels of the read voltages are adjusted and thereby a read error of the nonvolatile memory device 120 may be reduced. The read error is reduced and thereby data reliability of the nonvolatile memory device 120 may be improved.

Figure 16:
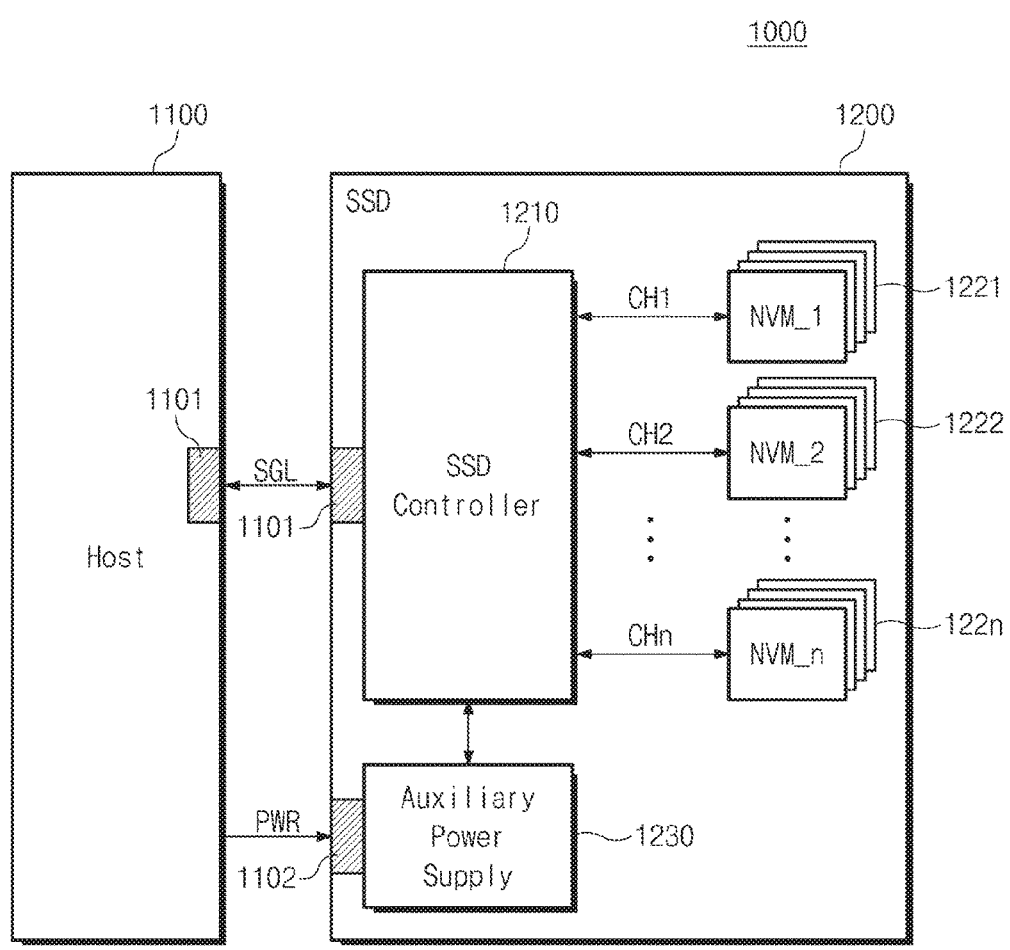
FIG. 16 is a block diagram illustrating a solid state drive (SSD) system including a nonvolatile memory storage system according to example embodiments of the inventive concept.

FIG. 16 is a block diagram describing a solid state drive (SSD) system including a nonvolatile memory storage system according to example embodiments of the inventive concept. Referring to FIG. 16, the SSD system may include a host 1100 and a SSD 1200.

The host 1100 writes data in the SSD 1200 or reads data stored in the SSD 1200. The host 1100 may exchange a signal SGL such as a command, an address, and state information with the SSD 1200 through a host interface 1101. The host interface 1101 may include various interfaces such as USB, MMC, PCI, PCI-E, ATA, SATA, PATA, SCSI, ESDI, IDE, MIPI, and NVMe, etc.

The SSD 1200 may exchange a signal SGL with the host 1100 through the host interface 1101 and may receive a power supply through a power connector 1102. The SSD 1200 may include a plurality of nonvolatile memory devices 1221 to 122n, a SSD controller 1210, and an auxiliary power supply 1230. Each of the plurality of nonvolatile memory devices 1221 to 122n may be implemented by PRAM, MRAM, ReRAM, and FRAM, etc. besides a NAND-type flash memory.

The nonvolatile memory devices 1221 to 122n may be used as storage medium of the SSD 1200. The nonvolatile memory devices 1221 to 122 may be connected to the SSD controller 1210 through a plurality of channels CH1 to CHn. At least one nonvolatile memory device may be connected to one channel. Nonvolatile memory devices connected to one channel may be connected to the same data bus.

The SSC controller 1210 exchanges a signal SGL with the host 1100 through a host interface 1201. The signal SGL may include a command, an address, data, etc. The host controller 1210 writes data in a corresponding nonvolatile memory device or reads data from a corresponding nonvolatile memory device according to a command of the host 1100.

The auxiliary power supply 1230 is connected to the host 1100 through the power connector 1201. The auxiliary power supply 1230 may receive a power supply from the host 1100. The auxiliary power supply 1230 may be located inside or outside the SSD 1200. For example, the auxiliary power supply 1230 may be located in a main board and may provide an auxiliary power supply to the SSD 1200.

The SSD 1200 may be the nonvolatile memory storage system 100 described with reference to FIGS. 1 through 13. The SSD 1200 may perform a cell count comparison operation to adjust a level of the read voltages. The level of the read voltages are adjusted and thereby a read error of the nonvolatile memory device 300(120, and 220) may be reduced. The read error is reduced and thereby data reliability of the nonvolatile memory device 300(120, and 220) may be improved.

The nonvolatile memory storage system according to the inventive concept may adjust a read voltage based on a cell count operation performed at a specific point in time while performing a read operation. Thus, a nonvolatile memory storage system having improved reliability and improved performance may be provided.

The contents described above are specific embodiments for implementing the inventive concept. The inventive concept may include not only the embodiments described above but also embodiments in which a design is simply or easily capable of being changed. The inventive concept may also include technologies easily changed to be implemented using embodiments.

What is claimed is:
1. A nonvolatile memory storage system comprising:
a nonvolatile memory device including a plurality of memory cells forming a three-dimensional (3D) structure, each memory cell constituted by a cell of discrete N levels and configured to read data stored in the plurality of memory cells based on a plurality of read voltages, the plurality of read voltages corresponding to the discrete N-levels, wherein N is a natural number greater than 2; and a memory controller configured to transmit a read command to the nonvolatile memory device so that the data is read from the nonvolatile memory device by applying the plurality of read voltages in a read sequence associated with the discrete N-levels, wherein the nonvolatile memory device is further configured to, perform a first read operation on a first level among the discrete N-levels based on a first read voltage among the plurality of read voltages, count a number of on-cells that respond to the first read voltage among the plurality of memory cells, and perform a second read operation by adjusting a value of a remaining second read voltage among the plurality of read voltages to be used to perform the second read operation on the first level or a second level among the discrete N-levels, the adjusting the value of the remaining second read voltage being according to a comparison result of the counted number of on-cells and a number of reference cells, wherein the read sequence includes the second read voltage being applied after the first read voltage.

2. The nonvolatile memory storage system of claim 1, wherein the number of reference cells is a value to reduce at least one of, a number of errors that occur due to a shift of a threshold voltage distribution of the plurality of memory cells, and an occurrence probability of errors.

3. The nonvolatile memory storage system of claim 1, wherein the memory controller is configured to transmit information of a read voltage value lookup table including a corresponding relation between the plurality of read voltages according to the number of reference cells corresponding to the first read voltage and a plurality of read voltage value changes to the nonvolatile memory device together with the read command.

4. The nonvolatile memory storage system of claim 3, wherein the nonvolatile memory device comprises a control logic and voltage generator configured to generate the plurality of read voltages, wherein the control logic and voltage generator comprises:

a cell count comparison circuit configured to compare the counted number of on-cells with the number of reference cells; and a read voltage value selector configured to output a new read voltage obtained by adding a value corresponding the second read voltage among the plurality of read voltage value changes to the second read voltage according to the comparison result.

5. The nonvolatile memory storage system of claim 1, further comprising a cell counter configured to count the number of on-cells that respond to the first read voltage.

6. The nonvolatile memory storage system of claim 1, wherein the nonvolatile memory device is further configured to:

perform the first read operation on the first level among the discrete N-levels based on the first read voltage among the plurality of read voltages;

count the number of on-cells that respond to the first read voltage among the plurality of memory cells while performing a third read operation on one of the first level, the second level and a third level among the discrete N-levels based on a third read voltage among the plurality of read voltages; and adjust a value of the second read voltage according to a comparison result of the counted number of on-cells and the number of reference cells.

7. The nonvolatile memory storage system of claim 1, wherein the memory controller is configured to calculate a plurality of read voltage value changes according to the number of reference cells corresponding to the first read voltage and transmit information of the plurality of calculated read voltage value changes to the nonvolatile memory device together with the read command.

8. The nonvolatile memory storage system of claim 1, wherein the second read voltage is the highest read voltage.

9. The nonvolatile memory storage system of claim 1, wherein when the counted number of on-cells is greater than the number of reference cells, the nonvolatile memory device adjusts a value of the second read voltage.

10. A nonvolatile memory storage system comprising:

a nonvolatile memory device configured to include a plurality of memory cells forming a three-dimensional (3D) structure; and a memory controller configured to control the nonvolatile memory device so that data is read from the nonvolatile memory device by applying a plurality of read voltages in a read sequence, wherein the nonvolatile memory device includes a plurality of memory cells each constituted by a cell of discrete N levels, where N is a natural number greater than 1;

wherein the nonvolatile memory device is further configured to, read data stored in the plurality of memory cells based on the plurality of read voltages, perform a first read operation on a first level among the discrete N-levels based on a first read voltage among the plurality of read voltages, count a number of on-cells or off-cells that respond to the first read voltage among the plurality of memory cells, and perform a second read operation by adjusting a value of a remaining second read voltage among the plurality of read voltages, the second read voltage being used to perform the second read operation on the first level or a second level among the discrete N-levels, the adjusting the value of the remaining second read voltage being according to a comparison result of the counted number of on-cells or off-cells and a number of reference cells, wherein the read sequence includes the second read voltage being applied after the first read voltage.

11. The nonvolatile memory storage system of claim 10, wherein the memory controller is configured to calculate a plurality of read voltage value changes according to the number of reference cells corresponding to the first read voltage and transmit information of the plurality of calculated read voltage value changes to the nonvolatile memory device together with a read command.

12. The nonvolatile memory storage system of claim 11, wherein the memory controller is configured to calculate the plurality of read voltage value changes based on access environment information of when accessing the nonvolatile memory device.

13. The nonvolatile memory storage system of claim 12, wherein the nonvolatile memory device comprises a control logic and voltage generator configured to generate the plurality of read voltages, wherein the control logic and voltage generator comprises:

a cell count comparison circuit configured to compare the counted number of on-cells or off-cells with the number of reference cells; and a read voltage value selector configured to output a new read voltage obtained by adding a value corresponding the second read voltage among the plurality of read voltage value changes to the second read voltage according to the comparison result.

14. The nonvolatile memory storage system of claim 10, further comprising a cell counter configured to count the number of on-cells or off-cells that respond to the first read voltage.

15. The nonvolatile memory storage system of claim 10, wherein when the counted number of off-cells is smaller than the number of reference cells, the nonvolatile memory device is configured to adjust a value of the second read voltage; and wherein when the counted number of on-cells is larger than the number of reference cells, the nonvolatile memory device is configured to adjust the value of the second read voltage.

\* \* \* \* \*